United States Patent [19]

Kundert et al.

[11] Patent Number: 5,335,191

[45] Date of Patent: Aug. 2, 1994

[54] METHOD AND MEANS FOR COMMUNICATION BETWEEN SIMULATION ENGINE AND COMPONENT MODELS IN A CIRCUIT SIMULATOR

[75] Inventors: Kenneth S. Kundert, Belmont, Calif.; Jacob K. White, Arlington, Mass.

[73] Assignee: Cadence Design Systems, Inc., San Jose, Calif.

[21] Appl. No.: 859,057

[22] Filed: Mar. 27, 1992

[51] Int. Cl.$^5$ .............................................. G06G 7/63
[52] U.S. Cl. .................................. 364/578; 364/580; 364/131
[58] Field of Search ............... 364/578, 579, 580, 131, 364/132, 133; 371/23

[56] References Cited

U.S. PATENT DOCUMENTS

| | | | |
|---|---|---|---|
| 4,744,084 | 5/1988 | Beck et al. | 371/23 |
| 4,751,637 | 6/1988 | Catlin | 395/500 |
| 4,866,663 | 9/1989 | Griffin | 364/578 |
| 4,914,612 | 4/1990 | Beece et al. | 364/578 |
| 4,916,647 | 4/1990 | Catlin | 364/578 |

FOREIGN PATENT DOCUMENTS 2164768A  3/1986  United Kingdom ......... G06F 15/60

*Primary Examiner*—Jack B. Harvey
*Assistant Examiner*—Jae H. Choi
*Attorney, Agent, or Firm*—Dennis S. Fernandez

[57] ABSTRACT

An apparatus and method for improved efficiency of operation of a circuit simulator. The simulation engine processor sends signals via flag registers to the component model processors to indicate which type of response is required from each component model. The component model processors send back only the requested response, thus minimizing processing time by avoiding generating response types that are not needed. Flexibility is enhanced by centralizing tasks in the simulation engine rather than in the component models, in order to facilitate experimentation and variation in circuit configurations without extensive modifications of component model design.

9 Claims, 3 Drawing Sheets

METHOD AND MEANS FOR COMMUNICATION BETWEEN SIMULATION ENGINE AND COMPONENT MODELS IN A CIRCUIT SIMULATOR

BACKGROUND OF THE INVENTION

1. Field of the Invention

This invention relates to the design of circuit simulators, and more particularly to a circuit simulator having a particular method and means of communication between the engine processor and the component processors. 2. Description of the Related Art A circuit simulator is a software-driven system used to predict the behavior of electrical circuits or other physical systems. Given a description of a circuit and a stimulus, the simulator generates and outputs the response of the circuit to the stimulus.

The user describes the circuit to the simulator by giving a list of components and a specification indicating how they are interconnected. Each component is described in terms of component primitives. The simulator has a mathematical model of each component primitive, and given the list of components, it is able to formulate a system of equations. The simulator then solves the system of equations and presents the solution to the user as the response of the circuit.

A circuit simulator can be thought of as having two major sections: an engine processor and one or more component processors.

Engine Processor

The engine processor consists of a processing unit and software code that is responsible for formulating and solving the system of equations. The engine processor takes the response generated by each component processor and combines them to develop the response of the entire circuit. It then sends a signal representing this response to the user.

Component Processors

There is one component processor for each component primitive supported by the simulator. Each component processor consists of a processing unit and software code which mathematically describes the characteristics of the particular component. The component processors are responsible for simulating the response of individual components given a stimulus provided by the engine processor.

Simulators support many different types of analyses, such as AC, DC, and transient. The component processors must support the special needs of each type of analysis. In addition, the needs of each analysis may change depending on which part of the analysis is being done or which method is being used to perform the analysis. Conventionally, each such change requires modification of the software code in the component processors.

In conventional simulators, the component processors generate different types of information based on the form of analysis being performed by the engine processor. Therefore, the engine processor must tell the component processors what type of analysis is being performed, and the component processors' software must be altered so that it can provide the response appropriate for that type of analysis. Furthermore, depending on the analysis, the component processors may be required to save past states of the components in order to generate correct information.

Consequently, in conventional simulators, the components' software code is often lengthy and complex, making it difficult for users to create and connect new components. Considerable information must be passed between the engine processor and the component processors, thus slowing the operation of the simulator. Past states must be saved in memory, using valuable memory space and further reducing speed. Finally, the user is required to modify all of the component models for each new type of analysis to be performed, making it cumbersome to try out various analyses on a single circuit.

SUMMARY OF THE INVENTION

In accordance with the present invention, a circuit simulator is disclosed which has a method and means for improved efficiency of operation by providing a new system of communication between the engine processor and the component processors. In the present invention, the engine processor receives signals from the user which specify the type of circuit response information the user needs. The engine processor determines what type of response it requires from each component in order to generate the desired circuit response. The engine processor communicates its needs to the component processors by means of flag registers. The component processors then simulate the behavior of electrical components, generating only the required information as indicated by the flag values. The component processors pass this information to the engine processor by means of data registers.

Under this system, there is no need for the engine processor to communicate extensive information regarding the overall analysis to each processor running component models. Rather, the engine processor determines what information is needed from each model, and sets flags accordingly. The component processors need not save past states, as the engine processor handles the details of saving and computing relevant information for dynamic components.

Centralizing the processing tasks in this manner yields greatly simplified component models, thus making it easier to design new types of component models and connect them to the engine. It also speeds up the circuit simulator by reducing the amount of information which must be passed among the processors. Memory space is conserved, since the component models do not have to save past states. Finally, the user is not required to change the component code to suit new forms of analysis. Thus, the invention greatly facilitates the introduction of numerous new analyses and variations.

DESCRIPTION OF THE PREFERRED EMBODIMENT

Figure 1:
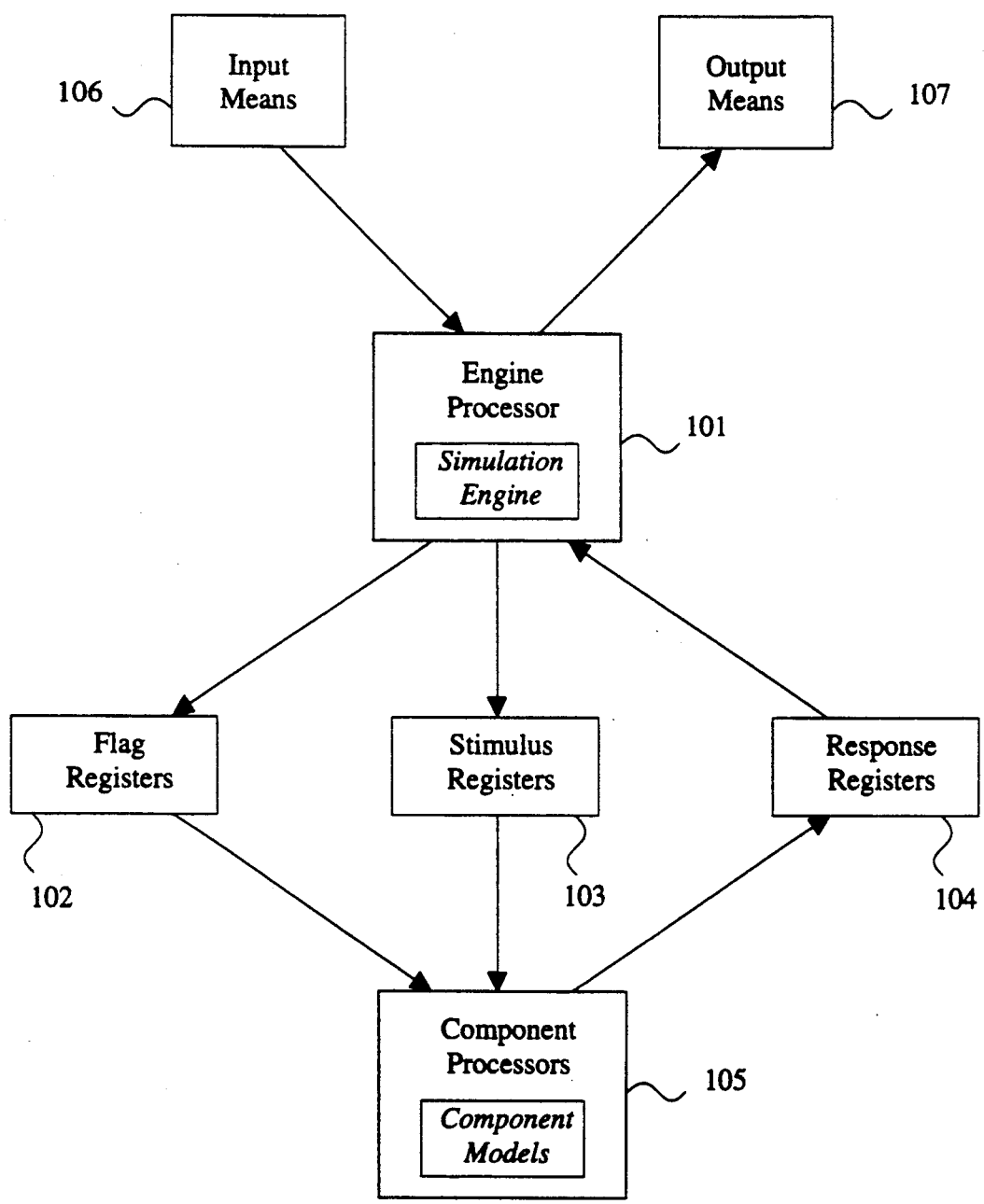
FIG. 1 is a block diagram of the simulator apparatus of the present invention.

Referring now to FIG. 1, there is shown a block diagram of the preferred embodiment of the present invention. The engine processor 101 is shown running the engine, and the component processors 105 are shown running the components. There is one component processor 105 for each component in the simulator. Input means 106, for receiving signals from the user, and output means 107, for transmitting response information to the user, are shown connected to the engine processor 101.

The flag registers 102, stimulus registers 103, and response registers 104 are shown connected to both processors. There is one set of flag registers 102 for each component model in the simulator. Within each set, there is one flag register 102 for each type of response the component processors 105 are capable of generating. There is one stimulus register 103 for each node in the circuit (a node is a point where components connect in a physical circuit). There is also one set of response registers 104 for each component processor. Within each set, there is one response register 104 for each type of response the component processors 105 are capable of generating.

In the preferred embodiment, the system of the present invention is executed on a general purpose computer, for example, of the type commercially available from Sun Microsystems, Inc., of Mountain View, Calif.

The apparatus operates as follows. Using input means 106, the user provides input describing the configuration of the circuit and specifying the type of analysis desired. The engine processor 101 makes an initial guess of the values at each node in the circuit and generates stimulus information for each node based on this guess. The engine processor 101 also sets the flag registers 102 to specify the type of information the engine processor 101 needs from each component to fulfill the user's to requests. The flag registers 102 store these flags.

The component processors 105 read these registers 102 and 103, generate the requested response information, and place the information in the response registers 104. The engine processor 101 reads the response registers 104 and updates the stimulus registers in accordance with the new information. If the response values have changed from the initial guess, the new stimulus is sent to the component models for them to generate new response values. The engine processor 101 compares the new response values with the response values from the previous iteration. This process is repeated until the response values do not change from one iteration to the next (i.e., they have stabilized). Once the response values have stabilized, the engine processor 101 generates and outputs the response of the circuit as a whole.

Figure 2:
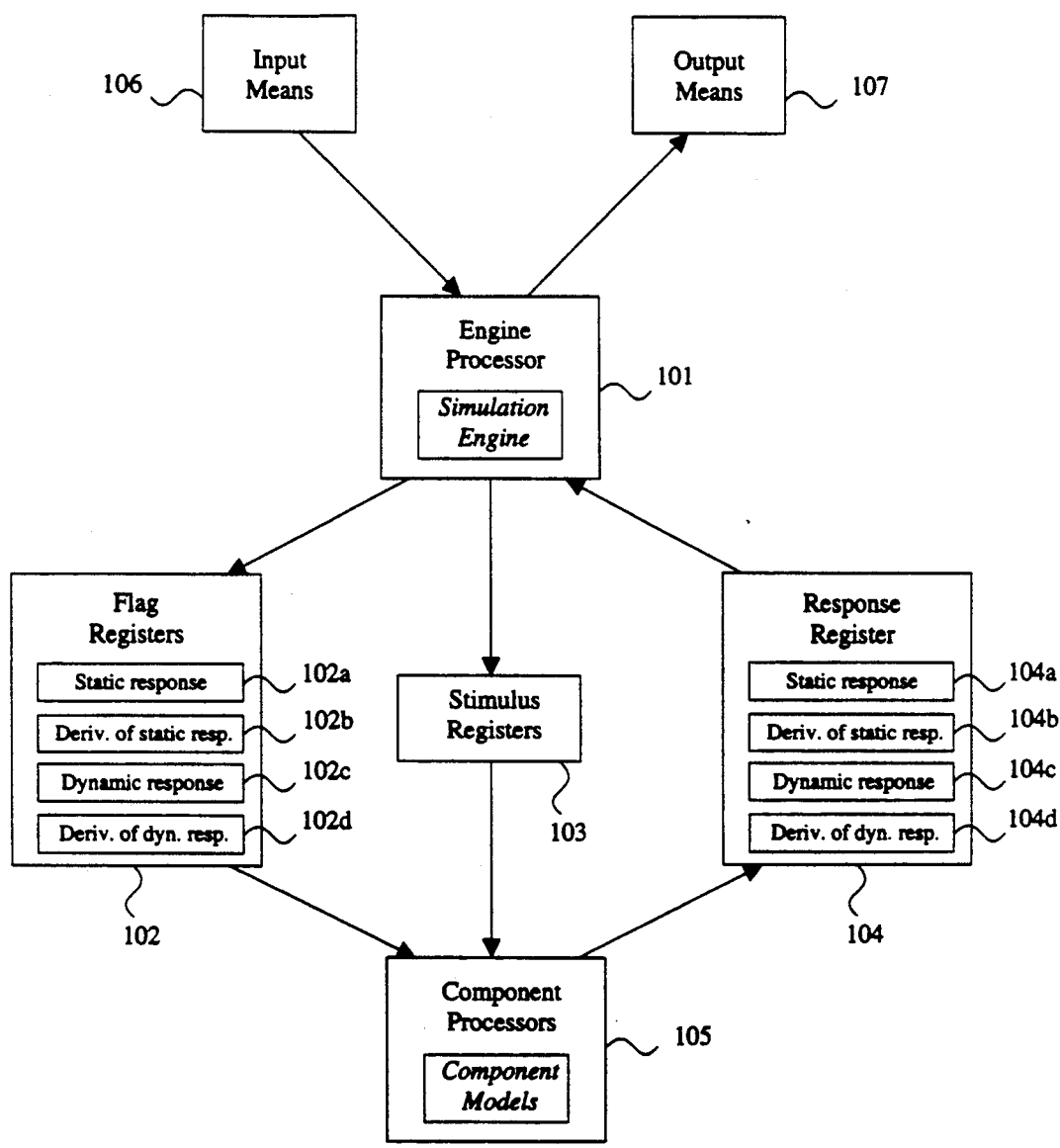
FIG. 2 is a block diagram of the simulator apparatus of the present invention wherein there are four flag registers per set and four response registers per set.

Referring now to FIG. 2, there is shown a block diagram similar to that of FIG. 1, except that the set of flag registers 102 and the set of response registers 104 are shown with four registers each. Each of the four registers corresponds to a type of response that the component processors 105 can generate. The four registers indicated represent the four most commonly requested response types: the static response, the derivative of the static response, the dynamic response, and the derivative of the dynamic response.

Accordingly, each set of flag registers 102 now consists of four registers: the static response flag register 102a, the derivative of static response flag register 102b, the dynamic response flag register 102c, and the derivative of dynamic response flag register 102d. Each of these flags can be set to "on" to indicate a request for the corresponding type of response, or "off" to indicate that the corresponding type of response is not needed.

Similarly, each set of response registers 104 now consists of four registers: the static response register 104a, the derivative of static response register 104b, the dynamic response register 104c, and the derivative of dynamic response register 104d. Each of these registers holds response information corresponding to the particular form of response computed by the component processors 105.

Figure 3:
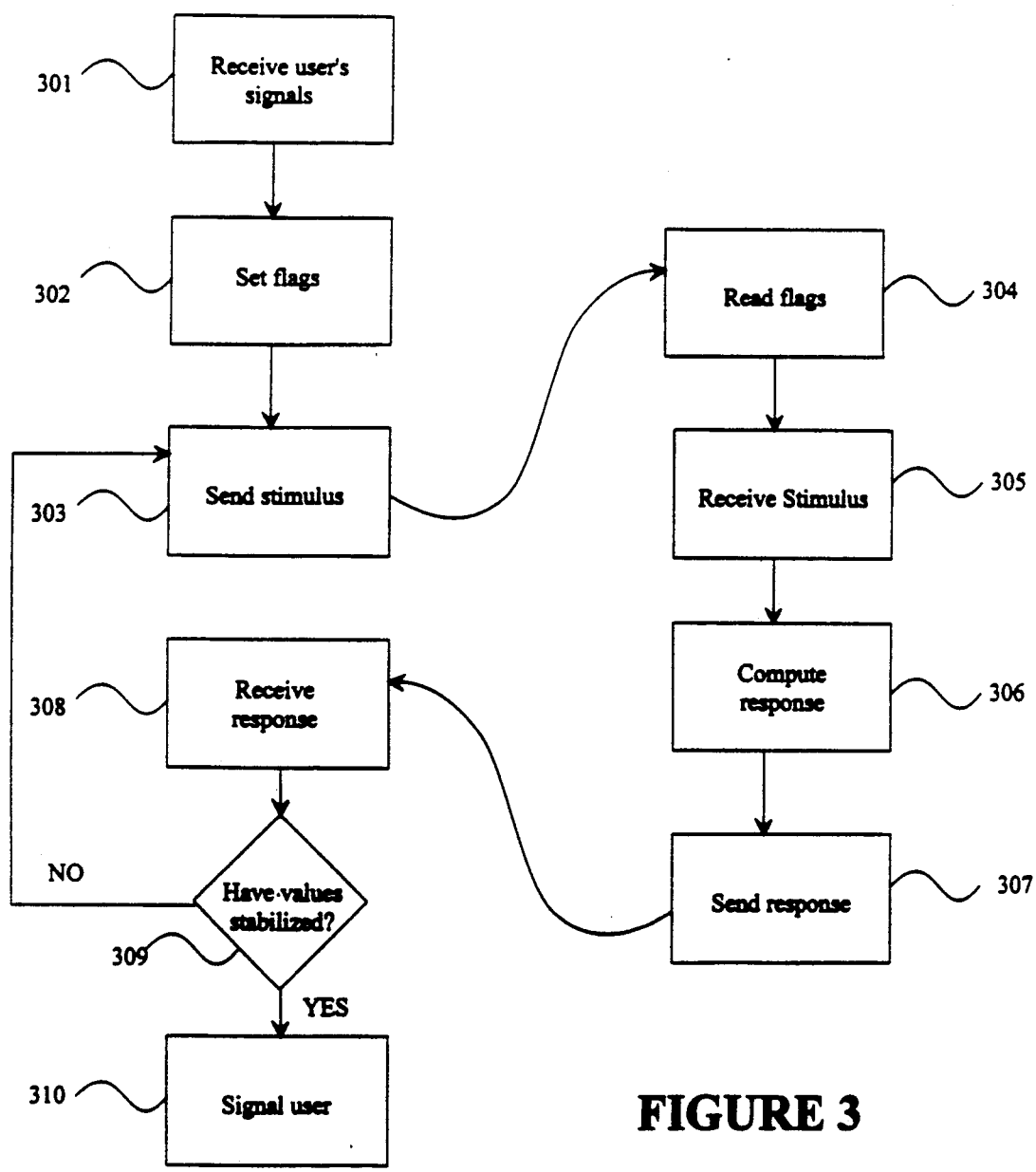
FIG. 3 is a flow chart showing the method of communication among the processors.

Referring now to FIG. 3, there is shown a flow chart of the steps performed by the processors. On the left side of the flow chart are the steps to be performed by the engine processor 101. On the right side of the flow chart are the steps to be performed by the component processors 105.

In step 301, the user provides input to the engine processor 101 describing the configuration of the circuit and specifying the analysis desired. Typically, the user will request AC analysis, DC analysis, transient analysis, or some combination of these. Then, in step 302, based on the type of analysis specified by the user, the engine processor 101 sets the flag registers 102 to specify the type of information the engine processor 101 needs in order to generate the requested analysis.

In step 303, the engine processor 101 places stimulus information in the stimulus registers 103. This stimulus information is a representation of the stimulus that would be present at the various nodes in the simulated circuit. Initially, the engine processor 101 makes a guess at these values. In subsequent iterations, the values are revised in accordance with the response of the components.

In step 304, the component processors 105 read the flags to determine what information is needed from each component processor 105. Then, in step 305, the component processors 105 read the stimulus from the stimulus registers 103.

Now the component processors 105 have all the information they need to model the response of the components. In step 306, based on the stimulus information supplied to each component, the component processors 105 generate the requested response information. In step 307, the component processors 105 place this information in the response registers 104.

In step 308, the engine processor 101 reads the response information from the response registers 104 and calculates new values for the nodes. In step 309, the engine processor 101 compares the new values with the values generated in the previous iteration (or those generated for the initial guess, if this is the first iteration). If the values have not changed (in other words, they have stabilized), the engine processor 101 proceeds to step 310. Otherwise, it loops back to step 303 to perform another iteration. The sequence from step 303 to step 309 repeats itself until the node values have stabilized.

In step 310, engine processor 101 uses the stabilized node values to compute the response of the entire circuit and signal the user with this information.

The sequence repeats itself for as many iterations as are necessary to generate all of the information requested by the user.

We claim:

1. An apparatus for operating a circuit simulator comprising:
   an engine processor for generating overall circuit response when given the response of individual components;

input means connected to said engine processor for accepting input from an external source;

output means connected to said engine processor for sending engine processor output to an external destination;

flag communication means connected to receive flags from said engine processor and to transmit flags for specifying both the type of response, and the specific response information said engine processor requires;

response computation filtration means connected to said engine processor for determining the value of said flags to indicate the specific response information required;

stimulus communication means connected to receive stimulus from said engine processor and to transmit stimulus;

at least one component processor connected to receive flags from said flag communication means and to receive stimulus from said stimulus communication means, each said component processor capable of generating a variety of response information for a given type of response, each said component processor generating a subset of the available response information as indicated by said flags of one component when given a stimulus; and response communication means connected to receive response from said component processors and to transmit response to said engine processor.

2. The apparatus according to claim 1, wherein:

said flag communication means comprises at least one flag register per component processor, connected to be set by said engine processor and to be read by said corresponding component processor;

said stimulus communication means comprises one stimulus register per circuit node, connected to receive a stimulus from said engine processor and to be read by said component processors; and said response communication means comprises at least one response register per component processor, connected to receive a response from said corresponding component processor and to be read by said engine processor.

3. The apparatus according to claim 1, wherein:

said flag communication means comprises:

one "static" flag register per component processor, connected to be set by said engine processor and to be read by said corresponding component processor, for specifying whether the static response is required;

one "derivative of static" flag register per component processor, connected to be set by said engine processor and to be read by said corresponding component processor, for specifying whether the derivative of the static response is required;

one "dynamic" flag register per component processor, connected to be set by said engine processor and to be read by said corresponding component processor, for specifying whether the dynamic response is required; and one "derivative of dynamic" flag register per component processor, connected to be set by said engine processor and to be read by said corresponding component processor, for specifying whether the derivative of the dynamic response is required; and said stimulus communication means comprises one stimulus register per circuit node, connected to receive a stimulus from said engine processor and to be read by said component processors; and said response communication means comprises:

one "static" response register per component processor, connected to receive the static response from said corresponding component processor and to be read by said engine processor;

one "derivative of static" response register per component processor, connected to receive the derivative of the static response from said corresponding component processor and to be read by said engine processor;

one "dynamic" response register per component processor, connected to receive the dynamic response from said corresponding component processor and to be read by said engine processor; and one "derivative of dynamic" response register per component processor, connected to receive the derivative of the dynamic response from said corresponding component processor and to be read by said engine processor.

4. A method of communication between an engine processor and at least one component processor, comprising the steps of:

(a) determining the specific response information required by each component processor;

(b) communicating signals to each component processor representing requests for specific types of response information by setting at least one flag register for at least one of the component processors and reading each flag register by the corresponding component processor;

(c) sending stimulus to each component processor;

(d) generating the requested response; and (e) sending a subset of the available response information as requested to the engine processor.

5. The method according to claim 4, further comprising the steps of:

receiving signals from an outside source as a first step; and signalling the response to an outside destination as a final step.

6. The method according to claim 5, wherein step (b) comprises the steps of:

setting one "static" flag register per component processor by the engine processor to specify whether the static response is required;

setting one "derivative of static" flag register per component processor by the engine processor to specify whether the derivative of the static response is required;

setting one "dynamic" flag register per component processor by the engine processor to specify whether the dynamic response is required;

setting one "derivative of dynamic" flag register per component processor by the engine processor to specify whether the derivative of the dynamic response is required;

reading each "static" flag register by the corresponding component processor to determine whether the static response is required;

reading each "derivative of static" flag register by the corresponding component processor to determine whether the derivative of the static response is required;

reading each "dynamic" flag register by the corresponding component processor to determine whether the dynamic response is required; and reading each "derivative of dynamic" flag register by the corresponding component processor to determine whether the derivative of the dynamic response is required.

7. The method according to claim 6 wherein step (c) comprises the steps of:

placing the stimulus for each circuit node into a corresponding stimulus register; and reading each stimulus register by the component processors.

8. The method according to claim 7, wherein step (e) comprises the steps of:

placing the response for each component processor into at least one response register; and reading the response registers by the engine processor.

9. The method according to claim 7, wherein step (e) comprises the steps of:

placing the static response for each component processor into a corresponding "static" response register, if the corresponding "static" flag register indicates that such information was requested;

placing the derivative of the static response for each component processor into a corresponding "derivative of static" response register, if the corresponding "derivative of static" flag register indicates that such information was requested;

placing the dynamic response for each component processor into a corresponding "dynamic" response register, if the corresponding "dynamic" flag register indicates that such information was requested;

placing the derivative of the dynamic response for each component processor into a corresponding "derivative of dynamic" response register, if the corresponding "derivative of dynamic" flag register indicates that such information was requested;

reading the "static" response register for each component processor by the engine processor, if the corresponding "static" flag register indicates that such information was requested;

reading the "derivative of static" response register for each component processor by the engine processor, if the corresponding "derivative of static" flag register indicates that such information was requested;

reading the "dynamic" response register for each component processor by the engine processor, if the corresponding "dynamic" flag register indicates that such information was requested; and reading the "derivative of dynamic" response register for each component processor by the engine processor, if the corresponding "derivative of dynamic" flag register indicates that such information was requested.

* * * * *